US007928764B2

(12) United States Patent
Yu et al.

(10) Patent No.: US 7,928,764 B2
(45) Date of Patent: Apr. 19, 2011

(54) PROGRAMMABLE INTERCONNECT NETWORK FOR LOGIC ARRAY

(75) Inventors: John Jun Yu, Beijing (CN); Fungfung Lee, Beijing (CN); Wen Zhou, Beijing (CN)

(73) Assignee: Agate Logic (Beijing), Inc., Beijing (CN)

( * ) Notice: Subject to any disclaimer, the term of this patent is extended or adjusted under 35 U.S.C. 154(b) by 0 days.

(21) Appl. No.: 12/375,560

(22) PCT Filed: Aug. 31, 2006

(86) PCT No.: PCT/CN2006/002238
§ 371 (c)(1),
(2), (4) Date: May 6, 2009

(87) PCT Pub. No.: WO2008/028330
PCT Pub. Date: Mar. 13, 2008

(65) Prior Publication Data
US 2009/0261858 A1    Oct. 22, 2009

(51) Int. Cl.
*H01L 25/00*    (2006.01)
*H03K 19/173*    (2006.01)
*G11C 5/00*    (2006.01)
(52) U.S. Cl. .................. 326/41; 326/38; 326/47; 365/63
(58) Field of Classification Search .............. 326/37–41, 326/47; 365/63, 68
See application file for complete search history.

(56) References Cited

U.S. PATENT DOCUMENTS

| | | | |
|---|---|---|---|
| 4,845,678 A * | 7/1989 | van Berkel et al. | 365/230.06 |
| 5,296,759 A * | 3/1994 | Sutherland et al. | 326/47 |
| 5,880,598 A * | 3/1999 | Duong | 326/41 |
| 5,924,115 A * | 7/1999 | Von Herzen et al. | 711/117 |
| 6,252,792 B1 * | 6/2001 | Marshall et al. | 365/63 |
| 6,262,908 B1 * | 7/2001 | Marshall et al. | 365/63 |
| 6,367,054 B1 * | 4/2002 | Talwar | 326/40 |
| 6,542,394 B2 * | 4/2003 | Marshall et al. | 365/63 |
| 6,693,456 B2 * | 2/2004 | Wong | 326/41 |
| 6,940,308 B2 * | 9/2005 | Wong | 326/41 |
| 7,068,070 B2 * | 6/2006 | Or-Bach | 326/38 |
| 7,176,714 B1 * | 2/2007 | Lee et al. | 326/38 |
| 2001/0003428 A1 * | 6/2001 | Or-Bach | 326/39 |
| 2001/0038298 A1 * | 11/2001 | Marshall et al. | 326/41 |
| 2005/0063373 A1 * | 3/2005 | DeHon et al. | 370/380 |

OTHER PUBLICATIONS

International Search Report (PCT/ISA/210) dated Apr. 11, 2007.

* cited by examiner

*Primary Examiner* — James H. Cho
*Assistant Examiner* — Matthew C Tabler
(74) *Attorney, Agent, or Firm* — Buchanan Ingersoll & Rooney, PC

(57) ABSTRACT

A programmable interconnect network for an array of logic cells. Said interconnect network has a plurality of switch boxes being connected in a tree structure and providing connections to its logic cells, switch boxes located at the lowest level of the tree structure are connected to logic cells; said interconnect network also has peripheral switch boxes, of which at least one is connected to an external logic. Also, an integrated circuit comprising an FP array of logic cells connected by the said programmable interconnect network and a mask programmable (MP) logic array.

14 Claims, 5 Drawing Sheets

PROGRAMMABLE INTERCONNECT NETWORK FOR LOGIC ARRAY

TECHNICAL FIELD

This invention relates to an integrated circuit and, more specifically, a programmable interconnect network of logic array.

BACKGROUND OF THE INVENTION

There are many applications which require integrated circuit with configurable interconnect networks. One such application is a FPGA (Field Programmable Gate Array) or field programmable logic cell array where logic cells are to be connected to each other by configurable interconnect networks. Functioning either as a stand-alone chip or as a core part in a system, configurable logic cell arrays are widely used in numerous microelectronic devices.

A conventional interconnect network for field programmable (FP) logic cell array is in planar structure, in which connection cells are configured to connect logic cells of the array to switch cells and connections are made between switch cells and their respective neighboring switch cells. Such a planar interconnect network is quite easy to build physically, but not straightforward to implement logic functions. The interconnect network would become quite complex in order to connect an arbitrary logic cell to another cell of the array. Also, the planar interconnect, network may result in a long routing delay for worst case, which is proportional to the square root of N, wherein N is number of cells in the logic cell array. As the array becomes larger, timing would become more critical and problematic. In addition, the planar network lacks scalability. As the network expands, every switch cell should be expanded to accommodate changing interconnection demands.

Logically, tree-based network can provide a better solution for interconnection of logic cells. Such a tree-based interconnect network, is illustrated in FIG. 1. In FIG. 1, logic cells act as leaves of the tree. Neighboring leaves are connected to first-level switch boxes, and neighboring switch boxes of lower levels are connected to higher-level switch boxes. However, it is difficult to map such a tree-based interconnect network to a highly integrated circuit, which is generally square-shaped.

U.S. Pat. Nos. 6,693,456 and 6,940,308, disclosed a tree-based hierarchical interconnection architecture for integrated circuits, in which logic cells are in row-column layout and interconnections therebetween are of tree structure. The hierarchical interconnect architecture brought forth high efficiency and scalability in interconnection network.

A problem arises when trying to connect logic cells in FP logic cell array to external logics in such a tree-based interconnect network. That is, only peripheral logic cells could be connected to external logics by using conventional method due to limited metal routing tracks. For an L*L FP logic cell array, where L is number of logic cells per row or column, only 4L-4 logic cell could interact with external logics. As FP array and interconnection thereof become larger, utilizing efficiency $4L/L^2=4/L$ decreases dramatically.

SUMMARY OF THE INVENTION

Therefore, it is an object of the present invention to provide a new interconnect network architecture for FP logic cell array design.

This object is achieved, according to a first aspect of the present invention, by providing a programmable interconnect network for an array of logic cells. Said interconnect network comprises a plurality of switch boxes being connected in a tree structure and providing connections to its logic cells, switch boxes located at the lowest level of the tree structure are connected to logic cells; said interconnect network, also comprises peripheral switch boxes, of which at least one is connected to an external logic.

According to a second aspect, the present invention provides an integrated circuit. Said integrated circuit comprises an FP array of logic cells connected by the programmable interconnect network according to the first aspect and a mask programmable (MP) logic array.

The above and other objects, features, and advantages of the present invention will become apparent from the following detailed description thereof, which is described with reference to the accompanying drawings in which the like reference numerals represent the same or similar elements.

DETAILED DESCRIPTION OF THE PREFERRED EMBODIMENTS

Figure 1:
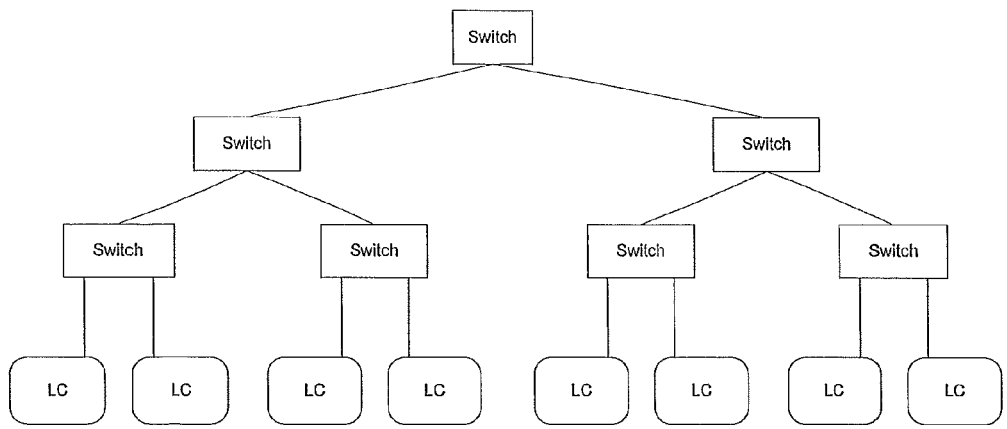
FIG. 1 illustrates a tree-based interconnect network.
Figure 2:
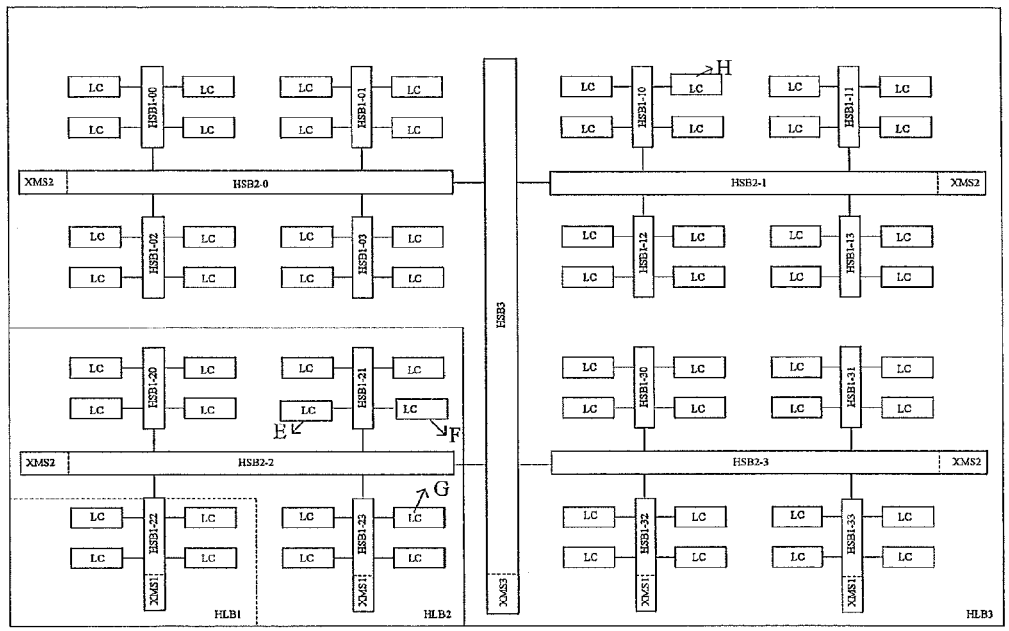
FIG. 2 illustrates a tree based hierarchical architecture of interconnect network for FP logic cells according to an embodiment of the present invention.

FIG. 2 illustrates a tree based hierarchical architecture of interconnect network for FP logic cells according to an embodiment of the present invention. As shown in FIG. 2, an 8*8 logic cell array consisting of 64 logic cells (LC) is provided. The LCs are interconnected by an interconnect network, which is formed by hierarchical switch boxes (HSBs) in a 3-level quad-tree hierarchical architecture. The HSBs are configured to implement programmable routing paths to all the LCs. More specifically, four neighboring LCs are connected to one hierarchical switch box (HSB) in level L1, i.e. HSB1. Four neighboring HSBs in L1 are connected to one HSB in level L2, i.e. HSB2. Four neighboring HSBs in level L2 are connected to one HSB in level L3, i.e. HSB3. For better illustration, HSBs in lower level are referred to as children HSBs, and HSBs in higher level, which are connected to the children HSBs, are referred to as parent HSBs.

For clarity, a logic block formed by a HSB1 and four LCs connected by the HSB1 is referred to as Hierarchical Logic Block in level 1 (HLB1). A logic block formed by a HSB2 and four HLBs in L1 connected thereby are referred to as HLB2. The whole block, which is formed by HSB3 and the four HSBs in L2, is referred to as HLB3. Again, HLBs in lower level are referred to as children HLBs, and HLB in higher level, which is formed by the children HLBs, is referred to as parent HLB.

Please note that the HSBs in the figure are labeled with additional numbers. Since there is only one HSB in L3 level, and thus no need of further labeling for this HSB3. In L2 level, a HSB is labeled as HSB2-M, where M is a position index and may have a value selected from 0, 1, 2 and 3, depending on the position of the HSB relative to the other three HSBs in L2. For example, the position index "0" represents the top left corner, "1" represents the top right corner, "2" represents the bottom left corner, and "3" represents the bottom right corner. In L1 level, a HSB is labeled as HSB1-MN, where M represents the position index of HSB2 to which the HSB is connected, and N represents the position index of the HSB relative to the other three HSBs belonging to the same HLB in L2 and may have a value from 0, 1, 2, and 3.

Some HSBs located at peripheral of the logic cell array, for example HSB1-22, HSB1-23, HSB2-2, HSB2-0 and HSB3, are provided with external multiplexer switches (XMSs), for making connection to external logics. The XMS included in HSB1 is referred to as XMS1, XMS of HSB2 as XMS2, and XMS of HSB3 as XMS3. It should be noted that the XMS may be replaced by pass transistors, pass gates, or other switch boxes that execute logical selection and connection functions.

By means of the interconnect network of HSBs, an LC of the array may be connected to any other LC in the array. For example, an LC labeled as E (LC E) may be connected to HSB1-21 of L1, and then to an LC labeled as F (LC F). In another example, to connect the LC E to LC G, the routing path is preferred to include HSB1-21, HSB2-2, and HSB1-23. In a third example, when connecting from LC E to LC H, the routing path may include HSB1-21, HSB2-2, HSB3, HSB2-1 and HSB1-10.

Further more, by means of the interconnect network of HSBs and HSBs with XMS, an LC of the logic cell array can be connected to external logics. The logic cell array can generally be divided into peripheral LCs and internal LCs. The peripheral LCs may directly interact with external logics through their own inputs and outputs, without any further routing resource. The internal LCs, on the other hand, can not directly interact with external logics. Therefore, the interconnect network having XMSs will facilitate establishing connection between the internal LCs and the external logics. Generally, a signal from an LC may be routed via HSBs to another HSB containing an XMS and then to external logics.

In order to create a path from an internal LC to the external logics, the related EDA software needs to search the HLB holding the internal LC and its parent or grandparent HLBs for the one HSB containing XMS. If one found, the internal LC may be connected through this XMS externally. In case there are more than one HLB containing XMS, which may be in different hierarchical levels, the HLB providing the shortest routing path will be preferred. For example, the LC G may be connected to HSB1-23 and its associated XMS1, and then to external logics. For another example, the LC E may be connected to HSB1-21, HSB2-2 and its associated XMS2, then to external logics. Similarly, the routing path for LC H to external logics may include HSB1-10 and HSB2-1 and its associated XMS2.

Figure 3:
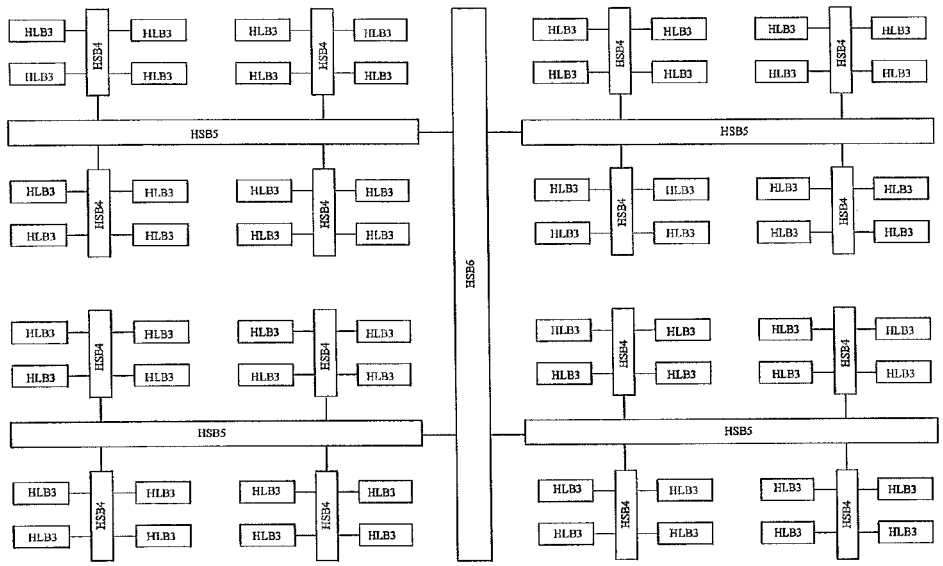
FIG. 3 illustrates a 6-level tree based interconnect network.

Although 3-level tree based interconnect network for an 8×8 LC array has been described in conjunction with FIG. 2, interconnect network having more than 3 levels can be adopted according to the present invention. FIG. 3 illustrates a 6-level tree based interconnect network. In FIG. 3, each HLB5 represents the entire logic block of FIG. 2. Four neighboring HLBs in L3 are connected to one HSB in level L4, i.e. HSB4. Four neighboring HLBs in L4 are connected to one HSB in level L5, i.e. HSB5. Four neighboring HLBs in level L5 are connected to one HSB in level L6, i.e. HSB6.

It should be understood that the hierarchical architectures in FIG. 3 may be expanded and the number of the levels may not be limited to 6. In another word, the architecture may have L7, L8, and L9 . . . . Please note that the number of children HLBs in a parent HLB may differ from one another.

Figure 4A:
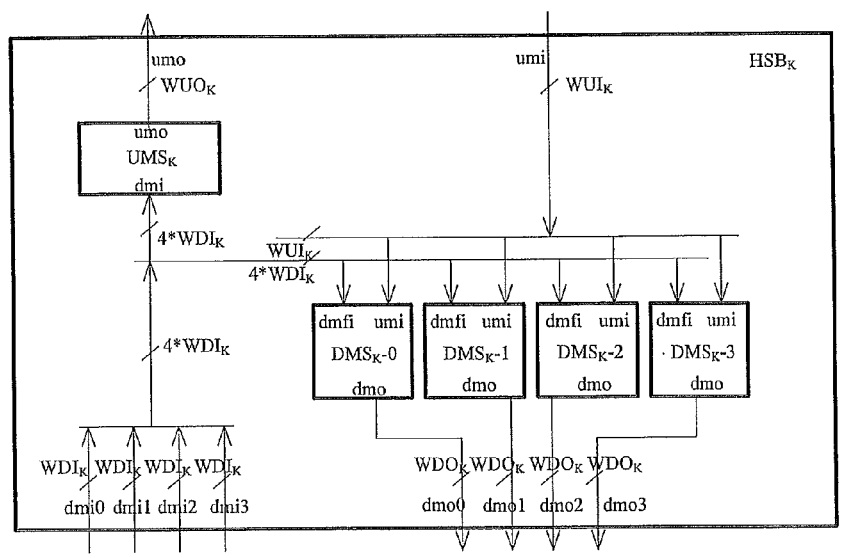
FIG. 4A illustrates a block diagram of an internal HSB of the interconnect network.

FIG. 4A illustrates a block diagram of an internal HSB of the interconnect network. The HSB is labeled as HSBk, where k represent the hierarchical level of the HSB so that HSBk may represent any HSB in FIG. 2 and FIG. 3 or HSB of even higher level.

In FIG. 4A, HSBk comprises a plurality of switch cells implemented by multiplexers (MUXs), i.e., upstream MUX switch UMSk, downstream MUX switch DMSk-0, DMSk-1, DMSk-2, and DMSk-3. The HSBk has downstream MUX inputs dmi0-dmi3, upstream MUX input umi, upstream MUX output umo and downstream MUX outputs dmo0-dmo3.

The inputs dmi0-dmi3 will be connected to outputs of four LCs connecting to the HSBk when k=1, or to outputs of four HSBs of level k−1 connecting to the HSBk when k is an integer other than 1. The outputs dmo0-dmo3 will be connected to inputs of the four LCs connecting to the HSBk when k=1, or to inputs of the four HSBs of level k−1 connecting to the HSBk when k is other than 1. The input umi will be connected to output of one of the HSBs of level k+1 connecting to the HSBk. The output umo will be connected to input of one of the HSBs of level k+1 connecting to the HSBk.

The UMSk functions to receive input signals WDIk from inputs dmi0-dmi3 and, under control of configuration bits, select one of the input signals WDIk as WUOk and output the same at umo.

The DMSk-j, in which j=0, 1, 2, or 3, has downstream MUX feedback inputs dmfi, upstream MUX input umi and downstream MUX output dmo, and is configured to receive input signals WDIk from inputs dmij and WUIk from input umi; and, under the control of configuration bits, selects signal from the input signals WDIk and WUIk as WDOk to be the output of respective dmoj.

Figure 4B:
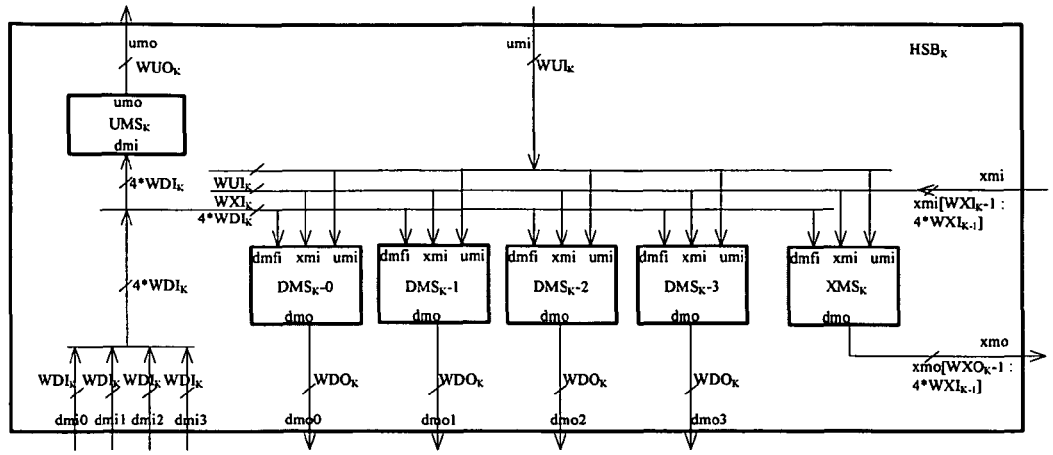
FIG. 4B illustrates a block diagram of a peripheral HSB of the interconnect network.

FIG. 4B illustrates block diagram of a peripheral HSB of the interconnect network. In FIG. 4B, the peripheral HSBk differs from that of FIG. 4A by further comprising an XMSk, input xmi and output xmo.

The input xmi is an external MUX input and will be connected to output of external logic. The output xmo is an external MUX output and will be connected to input of the external logic.

The XMSk functions to receive input signals WDIk from inputs dmi0-dmi3 and input signal WUIk from input umi. Then, XMSk selects, under control of configuration bits, one of the input signals as WXOk and output it to xmo. On the other hand, input signal from xmi is then sent to DMSk-0, DMSk-2, DMSk-2 and DMSk-3, one of which selects, under control of respective configuration bits, the signal and output it to one of dmo0-dmo3. To the extreme, the XMSk can be configured to receive input signal from input xmi as well.

It should be noted that the switch boxes as mentioned above may be implemented by pass transistors, pass gates, multiplexers or other elements that can execute logical selection and connectivity functions. The multiplexers (MUXs) are preferred since they need less space to store configuration bits compared to other switch boxes.

Figure 5:
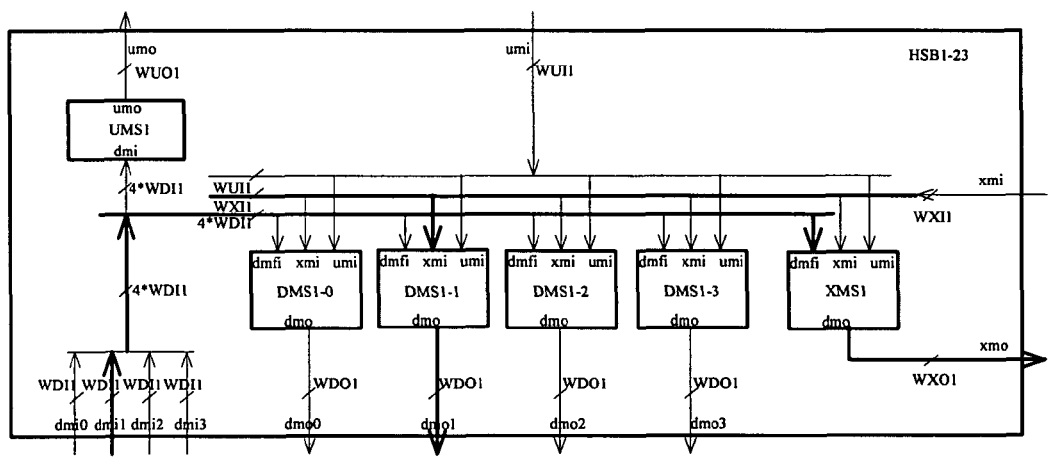
FIG. 5 is a signal flow chart illustrating how an LC G of FIG. 2 will be connected to external logic.

FIG. 5 is a signal flow chart illustrating how an LC G of FIG. 2 could be connected to external logic. In FIG. 5, HSB1-23 receives at position dmi1 an output signal from LC G. Within the HSB1-23, the signal is routed to input dmfi of XMS1. The XMS1 selects the signal and output the same via output xmo to external logic. On the other hand, HSB1-23 receives at position xmi a signal from external logic. The signal is then routed to input xmi of DMS1-1. The DMS1-1 selects this signal and sends it to output dmo1, which is connected to the input of LC G. Therefore, LC G can be connected to external logic via HSB1-23. It is noted that the j-indice of dmij, DMS1-j and dmoj represent the relative position for each of the signals to and from LC G to its parent HLB.

Figure 6:
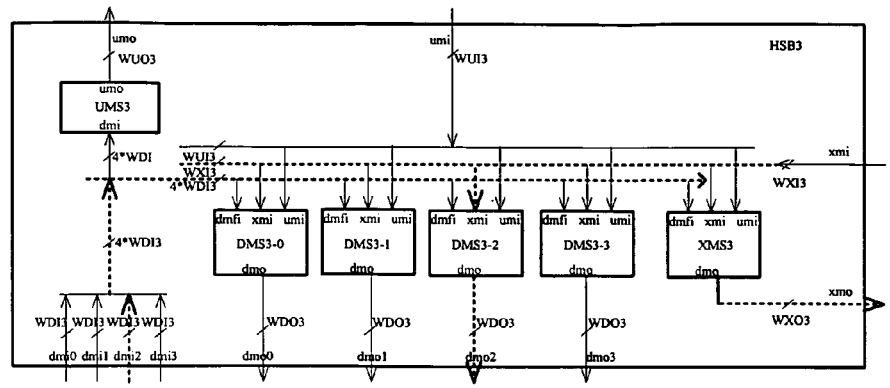
FIG. 6 is a signal flow chart illustrating how an LC E of FIG. 2 will be connected to external logic.
Figure 6:
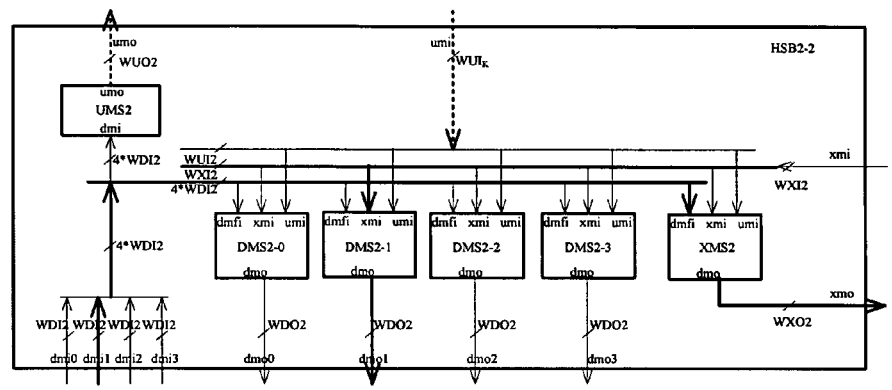
Figure 6:
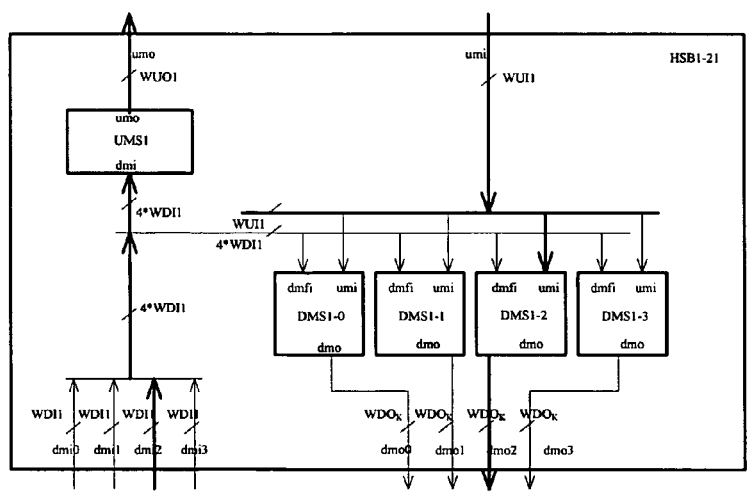

FIG. 6 is a signal flow chart illustrating how an LC E of FIG. 2 will be connected to external logic. Referring back to FIG. 2, logic cell E may visit external logic via a routing path including HSB1-21 and HSB2-2, or alternatively, via a second routing path including HSB1-21, HSB2-2 and HSB J. As shown in FIG. 6, there are three HSBs in different levels, i.e. HSB3, HSB2-2, and HSB1-21. Output umo and input umi of HSB1-21 are coupled respectively to input dmi1 and output dmo1 of HSB2-2. Output umo and input umi of HSB2-2 are coupled respectively to input dmi2 and output dmo2 of HSB3. Assume that input dmi2 and output dmo2 of HSB1-21 are coupled respectively to output and input of LC E.

When a signal needs to be routed to external logic from LC E, the signal goes into HSB1-21 via its input dmi2. Since HSB1-21 has no XMS, the signal is routed, via UMS1 and output umo of HSB1-21, to input dmi1 of HSB2-2; and is subsequently routed to external logic via XMS2 of HSB2-2 by signal xmo. On the other hand, when a signal needs to be routed from external logic to LC E, the signal goes into HSB2-2 via its input xmi. Within the HSB2-2, DMS2-1 selects the signal and routes it to dmo1. The signal dmo1 is subsequently routed to HSB1-21 via its input umi. Within the HSB1-21, DMS1-2 selects this signal and routes to dmo2, which is connected to input of LC E. Therefore, LC E can be connected through HSB1-21 and HSB2-2 to external logic. The routing path is shown as bold lines in FIG. 6.

In case that XMS2 of HSB2-2 is occupied by other LC routing path, the second routing path including HSB3 may be used instead. When a signal needs to be routed to external logic from LC E, the signal is routed from UMS2 of HSB2-2 further to HSB3, where XMS3 selects the signal and routes it to external logic. When a signal needs to be routed from external logic to LC E, the signal is first routed to input xmi of HSB3, in which DMS3-2 selects the signal and sends it to DMS2-1 of HSB2-2, then to DMS1-2 of HSB1-21, and finally to LC E. The part of the second routing path in HSB3 is shown in dotted line. Similar to the routing path in FIG. 5, all the indice of input, output, DMS in FIG. 6 are selected based on the relative position indice of LC E and its parent HLBs.

Figure 7:
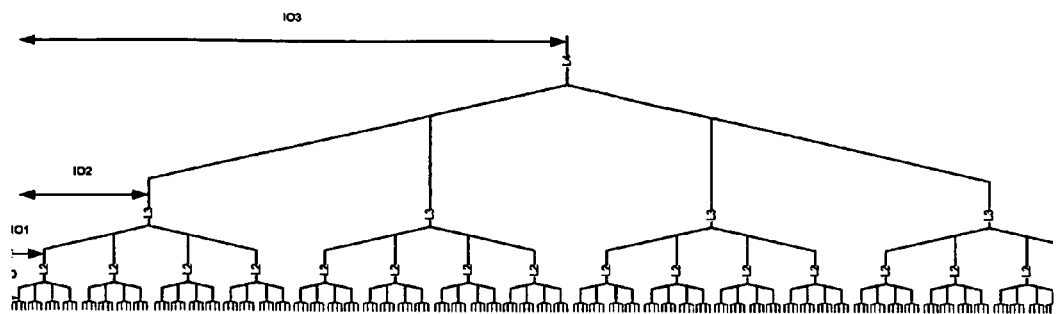
FIG. 7 illustrates a logic diagram of the tree based hierarchical architecture of interconnect network according to present invention.

FIG. 7 illustrates a logic diagram of the tree based hierarchical architecture of interconnect network according to present invention. As shown in FIG. 7, leaves at the bottom of the tree structure represent LCs in the FP logic cell array, and the trunks of various levels represent HSBs or HLBs. In other words, every four leaves (LCs) grow on and are supported by a trunk in level L1 (HSB1 or HLB1). Every four (children) trunks (HSB1 or HLB1) grow on and are supported by a parent trunk in level L2 (HSB2 or HLB2). Every four trunks (HSB2 or HLB2) grow on and are supported by a grandparent trunk in level L3 (HSB3 or HLB3), and so on. Only one trunk at each level is shown to have a XMS, for example IO0 at L1, IO1 at L2, IO2 at L2, and IO3 at L3. It should be understood that this is only for illustration purpose, and not limiting the scope of the present invention.

To connect a leaf or LC to external logic, the tree will be searched for a trunk with XMS and then a routing path between the leaf and the trunk should be identified. A preferred way is to search the parent trunks holding the leaf or LC. In particular, it is first to check whether the said leaf or said LC is a peripheral LC. If yes, make connection directly; if no, proceed to the next step to examine whether trunk or HSB of next higher level holding the said LC is with XMS. If yes, visit the XMS of the trunk or HSB, if no, proceed to check parent trunk(s) of higher levels, until a trunk with XMS is found. In addition, if more than one trunks of different levels are found to have XMS, the trunk of lower(est) level is preferred since it can provide a shorter(est) routing path for the leaf or LC to be connected to external logic. A long visiting path would inevitably lead to a long visiting time, hence lowering interconnection performance to some degree. However, it provides alternative paths to external logics, thus enhances the flexibility of the network, design, especially when the lower trunks are occupied by other leafs or LCs. Users can make tradeoff between the performance and flexibility, depending on specific applications. By means of the interconnect network according to the present invention, each internal LC can be connected via XMS of peripheral HSB to external logics with predictable timing, optimal path and high efficiency.

Figure 8A:
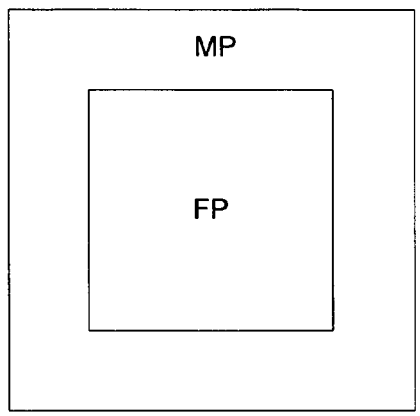
FIG. 8(A) shows a donut pattern formed by FP logic array and MP array.
Figure 8B:
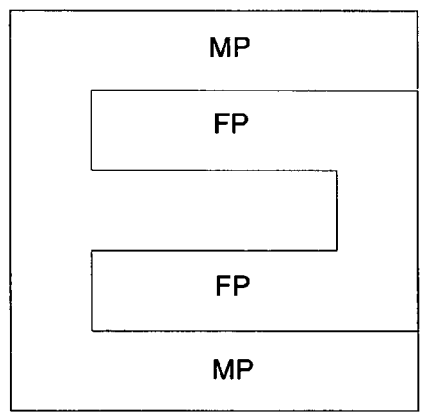
FIG. 8(B) shows a sandwich pattern formed by FP logic array and MP array.

One example of the external logic as mentioned above is MP (Mask Programmable) logic elements. Compared to conventional interconnect network, the interconnect network according to the present invention will provide more contacts and higher transmission speed between FP logic array and MP logic elements. FP logic array and MP logic elements may be integrated together as a circuit so as to achieve direct communication therebetween, increasing transmission efficiency. FIG. 8 illustrates two pattern of integration of FP logic array and MP array. FIG. 8(A) shows a donut pattern, in which FP array is surrounded by MP elements. FIG. 8(B) shows a sandwich pattern, in which MP array is consisted of three parts, between which is located FP elements. Please note that, in both FIG. 8(A) and FIG. 8(B), MP logic array can be replaced by any other external logic such as ASIC.

While there has been described in connection with the preferred embodiments of the invention, it will be obvious to those skilled in the art that various changes and modifications may be made therein without departing from the invention, and it is aimed, therefore, to cover in the appended claims all such changes and modifications as fall within the true spirit and scope of the invention, which is defined by the metes and bounds of the appended claims.

What is claimed is:

1. A programmable interconnect network for an array of logic cells, comprising:
   a plurality of switch boxes being connected in a tree structure and providing selection and connection for the logic cells, wherein the tree structure includes a top level switch box;
   wherein switch boxes located at the lowest level of the tree structure are connected to the logic cells; and
   wherein said plurality of switch boxes comprises at least one peripheral switch box which is connectable to external logics bypassing the top level switch box of the tree structure.

2. The programmable interconnect network as claimed in claim 1, wherein said at least one peripheral switch box comprises an external multiplexer switch, a multiplexer, a pass transistors transistor, or a pass gate.

3. The programmable interconnect network as claimed in claim 1, wherein each of said plurality of switch boxes comprises a plurality of first switch cells, each of which functions to receive a signal from a parent switch box and pass the signal to a child switch box, a logic cell or an external logic.

4. The programmable interconnect network as claimed in claim 3, wherein each of said first switch cells functions to receive signals from child switch boxes or logic cells and select one as output to another child switch box or logic cell.

5. The programmable interconnect network as claimed in claim 3, wherein each of said first switch cells functions to receive signals from the external logic and output the same to the child switch box, the logic cell or the parent switch box.

6. The programmable interconnect network as claimed in claim 1, wherein each of said plurality of switch boxes comprises a second switch cell, which functions to select signals from a child switch box or a logic cell and send the selected signals to a parent switch box.

7. The programmable interconnect network as claimed in claim 1, wherein said at least one peripheral switch box comprises a third switch cell, which functions to select one of signals from child switch boxes or logic cells as output to an external logic.

8. The programmable interconnect network as claimed in claim 7, wherein said third switch cell is coupled to receive signal from a parent switch box and output the received signal to the external logic.

9. The programmable interconnect network as claimed in claim 1, wherein said array comprises at least one peripheral logic cell, which is configurable to connect to an external logic.

10. The programmable interconnect network as claimed in claim 1, wherein said array comprises at least one internal logic cell, said at least one peripheral switch box is located at a trunk of the tree structure holding said at least one internal logic cell.

11. The programmable interconnect network as claimed in claim 10, further comprising a second peripheral switch box, wherein in case both of the peripheral switch boxes hold said at least one internal logic cell, the peripheral switch box of lower level is chosen.

12. An integrated circuit, comprising a field programmable (FP) array of logic cells connected by the programmable interconnect network as claimed in claim 1 to an external logic block.

13. The integrated circuit as claimed in claim 12, wherein the FP array of logic cells and the external logic forms a donut or sandwich pattern.

14. The integrated circuit as claimed in claim 12, wherein said external logic is a mask programmable (MP) logic array.

* * * * *